United States Patent [19]
Boe

[11] Patent Number: 6,124,552
[45] Date of Patent: Sep. 26, 2000

[54] MOTHERBOARD SCREWLESS MOUNTING SPACER

[75] Inventor: Craig L. Boe, Nampa, Id.

[73] Assignee: Micron Electronics, Inc., Boise, Id.

[21] Appl. No.: 08/988,863

[22] Filed: Dec. 11, 1997

[51] Int. Cl.[7] .............................. H01B 5/00; H05K 7/04
[52] U.S. Cl. ................. 174/135; 174/138 G; 361/804; 361/742
[58] Field of Search ............................. 174/135, 138 G, 174/166 S, 138 D, 138 E; 361/804, 742, 770

[56] References Cited

U.S. PATENT DOCUMENTS

| | | | |
|---|---|---|---|
| 3,066,367 | 12/1962 | Garman | 24/81 |
| 3,996,500 | 12/1976 | Coules | 317/101 CC |
| 4,389,759 | 8/1983 | Yuda | 24/214 |
| 4,495,380 | 1/1985 | Ryan et al. | 174/138 D |
| 4,627,760 | 12/1986 | Yagi et al. | 403/201 |
| 4,674,910 | 6/1987 | Hayashi | 403/408.1 |
| 4,701,984 | 10/1987 | Wyckoff | 24/573 |
| 4,938,703 | 7/1990 | Nakano | 439/74 |
| 5,191,513 | 5/1993 | Suguira et al. | 361/524 |
| 5,241,451 | 8/1993 | Walburn et al. | 361/785 |
| 5,452,184 | 9/1995 | Scholder et al. | 361/799 |
| 5,689,863 | 11/1997 | Sinozaki | 24/297 |
| 5,758,987 | 6/1998 | Frame et al. | 403/298 |
| 5,833,480 | 11/1998 | Austin | 439/95 |

*Primary Examiner*—Kristine Kincaid
*Assistant Examiner*—Mark Olds
*Attorney, Agent, or Firm*—Knobbe, Martens, Olson & Bear, LLP

[57] ABSTRACT

Disclosed is a device for mounting a planar electrical component, such as a computer motherboard, to a chassis. In one embodiment, the device includes a spacer including a coiled wall configured to be positioned between the board and the chassis, and an elongated clip coupled to the spacer. The elongated clip including an upper fastener extending in a first direction from the spacer. The upper fastener is configured to removably clamp onto the board and secure the board to the spacer. The elongated clip further comprises a lower fastener extending in a second direction from the spacer. The lower fastener is configured to removably clamp onto the chassis and secure the chassis to the spacer.

21 Claims, 3 Drawing Sheets

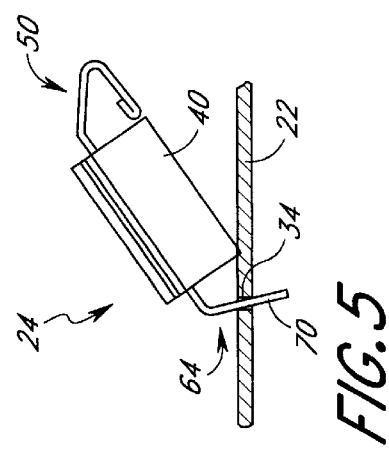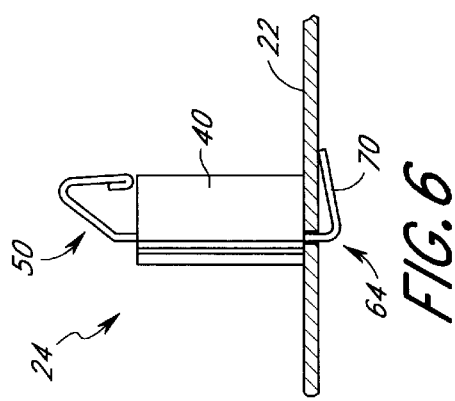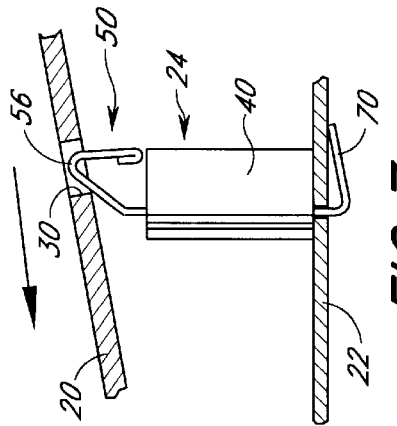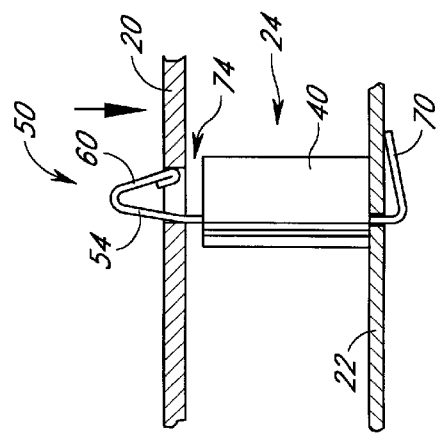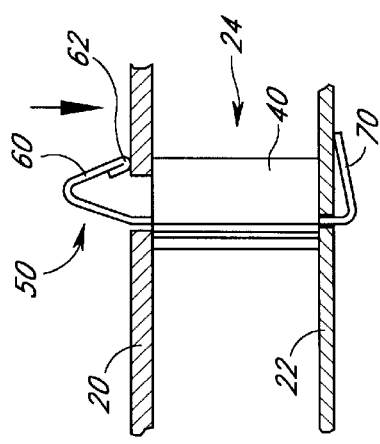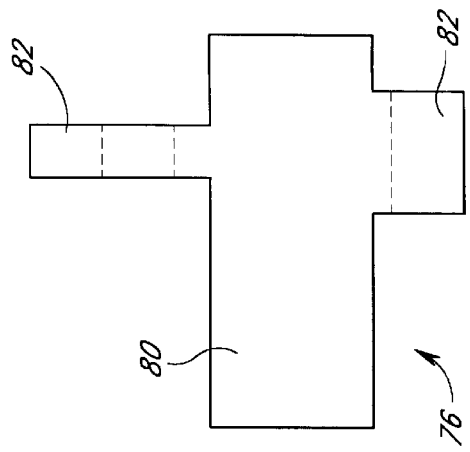

MOTHERBOARD SCREWLESS MOUNTING SPACER

RELATED APPLICATIONS

The subject matter of U.S. Patent Application entitled "METHOD OF MOUNTING A MOTHERBOARD TO A CHASSIS," filed on Dec. 11, 1992, Application No. 08/988, 946, and having attorney Docket No. PATENT.047A is related to this application.

BACKGROUND OF THE INVENTION

1. Field of the Invention

The invention relates to mounting spacers for circuit boards. More particularly, the invention relates to a device for easily and quickly mounting a motherboard to a computer chassis.

2. Description of the Related Art

During assembly of a computer, the computer motherboard must be fastened to the computer frame or chassis to secure the board during use against undesired movement relative to the chassis. In existing systems, the motherboard is mounted to the computer chassis using screws or bolts which are typically made of electrically conductive metal. The screws are inserted into any of several mounting holes in the motherboard, which are aligned with corresponding holes on the computer chassis. After insertion of the screws, an installer uses a screwdriver to tighten the screws and thereby securely mount the motherboard to the computer.

The mounting holes on the motherboard are often surrounded by a grounding pad. The grounding pad is a conductive surface that is used as an electrical ground for the motherboard. After mounting, the heads of the metal mounting screws contact the pads on the motherboard and thereby provide an electrical ground interface.

There are certain drawbacks associated with using screws to mount a motherboard to a computer chassis. One such drawback is the great amount of time it takes for an installer to insert the screws through the multiple mounting holes and then tighten each screw onto the motherboard. This process is tedious and time consuming. It is also time-consuming to remove the screws in order to remove the motherboard from the chassis for purposes such as repairs or maintenance.

There is, therefore, a need for a device that may be used to easily and quickly mount a motherboard to a computer chassis. Preferably, the device should secure the motherboard to the chassis without requiring screws. Additionally, the device preferably should be usable with existing motherboard designs and should also be capable of providing an electrical ground interface for the motherboard.

SUMMARY OF THE INVENTION

The aforementioned needs are satisfied by the present invention. In one aspect of the invention there is disclosed a device for mounting a planar electrical component, such as a computer motherboard, to a chassis. In one embodiment, the device comprises a spacer comprising a coiled wall configured to be positioned between the board and the chassis, and an elongated clip coupled to the spacer. The elongated clip comprising an upper fastener extending in a first direction from the spacer. The upper fastener is configured to removably clamp onto the board and secure the board to the spacer. The elongated clip further comprises a lower fastener extending in a second direction from the spacer. The lower fastener is configured to removably clamp onto the chassis and secure the chassis to the spacer.

In another aspect of the invention, there is disclosed a device for mounting a planar electrical component to a chassis. The device comprises a spacer having a first end and a second end. A first fastener extends outward from the first end of the spacer. The first fastener has a first arm biased toward the spacer, wherein the first fastener is configured to removably secure the board between the first arm and the first end of the spacer. The device further comprises a second fastener extending outward from the second end of the spacer. The second fastener has a second arm biased toward the second end of the spacer, wherein the second fastener is configured to removably secure the chassis between the second arm and the second end of the spacer.

In yet another aspect of the invention, there is disclosed a device for removably securing a planar electrical component to a chassis. The device comprises a spacer, means for removably clamping the board to a first side of the spacer, and means for removably clamping the chassis to a second side of the spacer.

Another aspect of the invention relates to a device for removably attaching a planar electrical board to a chassis. The device comprises a first fastener configured to removably attach to the board, a second fastener configured to removably attach to the chassis, and a spacer interposed between the first and second fasteners. The spacer separates the first and second fasteners by a predetermined distance.

BRIEF DESCRIPTION OF THE DRAWINGS

These and other features of the invention will now be described with respect to the drawings which are intended to illustrate and not to limit the invention and in which:

FIG. 5 is a side view of the mounting spacer illustrating the first step in the process of installing the mounting spacer in a computer chassis;

FIG. 6 is a side view of the mounting spacer illustrating that device after installation onto a chassis;

FIG. 7 is a side view of the mounting spacer illustrating the first step in the process of installing the mounting spacer onto a motherboard;

FIG. 8 is a side view of the mounting spacer illustrating the second step in the process of installing the mounting spacer onto a motherboard;

FIG. 9 is a side view of a motherboard mounted onto a chassis using the mounting spacer of the present invention; and FIG. 10 illustrates a material blank that is formed into the mounting spacer of FIG. 2.

DETAILED DESCRIPTION OF THE INVENTION

Figure 1:
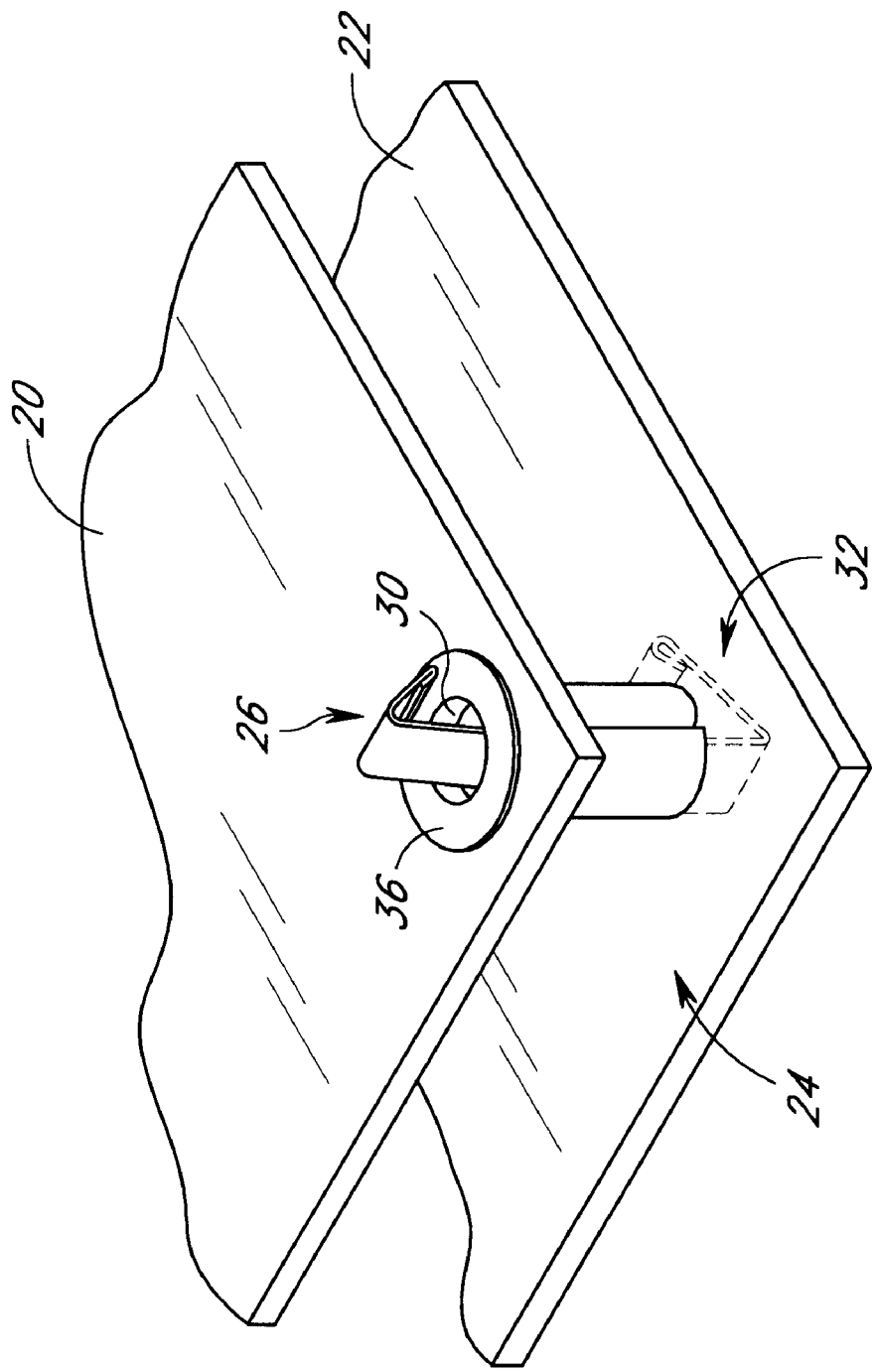
FIG. 1 is a perspective view of a motherboard mounted onto a computer chassis using the mounting spacers of the invention.

FIG. 1 is a perspective view of a planar motherboard 20 mounted onto a frame or chassis 22 of a computer using at least one mounting spacer 24 configured in accordance with one embodiment of the invention. As discussed in detail below, an installer may use the mounting spacers 24 to easily and securely mount the motherboard 20 to the chassis 22 without the use of mounting screws. The motherboard 20 is also easily removed from the chassis 22 and the mounting spacers 24, during repair, upgrade, or maintenance. Although described herein in the context of a motherboard 20 and computer chassis 22, it will be appreciated that the mounting spacer 24 may be used to mount a motherboard 20, or any other planar object, to any of a wide variety of structures having mounting slots.

As shown in FIG. 1, at least one mounting spacer 24 is used to attach the motherboard 20 to the chassis 22. In particular, a top end 26 of the mounting spacer 24 mates or couples with a mounting hole 30 that extends through the motherboard 20. The opposite or bottom end 32 (shown in phantom lines) of the spacer mates or coupled with a corresponding mounting slot 34 (FIG. 5) in the computer chassis 22 so that the motherboard 20 is separated from the chassis 22 by a distance equal to the height of the mounting spacer 24. The mounting holes 30 in the motherboard 20 are arranged so that they may be aligned with the mounting slots 34 on the chassis 22. The motherboard 20 and chassis 22 may be equipped with any number of mounting holes 30 and slots 34, respectively.

As shown in FIG. 1, a grounding pad 36 is positioned around the periphery of each of the mounting holes 30 in the motherboard 20. The top end 26 of the mounting spacer 24 contacts the grounding pad 36. The grounding pad 36 functions as an electrical ground for the motherboard 20 in a manner well known to those skilled in the art. Toward this end, one embodiment of the mounting spacer 24 is manufactured of an electrically-conductive material to provide an electrical ground connection between the mother board 20 and the chassis 22.

Figure 4:
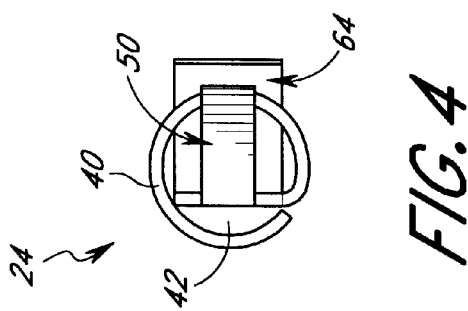
FIG. 4 is a top plan view of the mounting spacer of FIG. 2.
Figure 3:
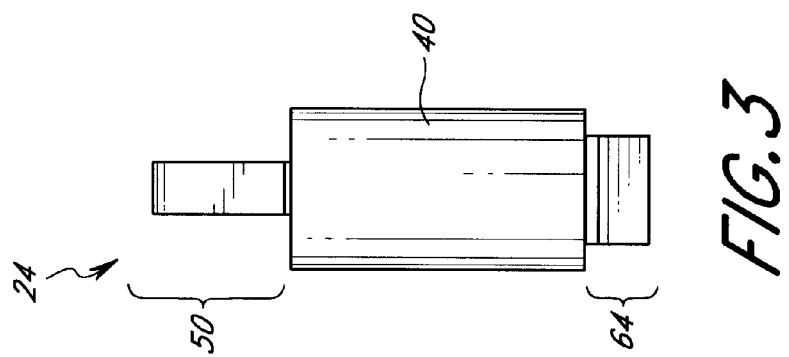
FIG. 3 is a front elevational view of the mounting spacer of FIG. 2.
Figure 2:
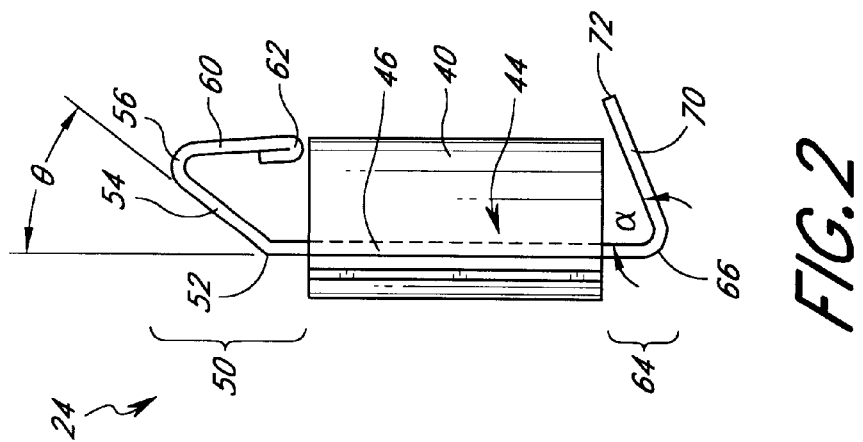
FIG. 2 is a side elevational view of one embodiment of the mounting spacer of the invention.

FIGS. 2, 3, and 4 are side, front, and top views, respectively, of one embodiment of the mounting spacer 24 of the invention. As shown, the mounting spacer 24 includes a spacer portion 40 comprising a wall that defines a substantially cylindrical shape and defines a hollow space 42 (FIG. 4) therein. The height and diameter of the spacer portion 40 may be varied to provide various spacing distances between the motherboard 20 and chassis 22.

As best shown in FIG. 2, the mounting spacer 24 further comprises a thin and elongated clip member 44 having a central portion 46 (shown in phantom) that extends through the hollow space 42 within the spacer portion 40. In the illustrated embodiment, the central portion 46 extends substantially parallel to the axis of the spacer portion 40 and is aligned slightly offset from the center axis of the spacer portion 40. As shown in FIG. 4, one end of the spacer portion 40 curves or coils into the hollow space 42 and integrally forms into the central portion 46 of the clip member. The coiled configuration reduces the likelihood of the mounting spacer 24 twisting during use.

With reference to FIG. 2, the clip member 44 further includes an upper clamp or fastener 50 that extends upward from the upper edge of the central portion 46 so as to protrude from the top of the spacer portion 40. The upper fastener 50 is configured to removably clamp the mounting spacer 24 to the motherboard 20, as described more fully below.

As best shown in FIG. 2, the upper fastener 50 includes a first bend 52 which defines a first arm 54 of the upper fastener 50 that is oriented at an angle θ relative to the central portion 46. The upper fastener 50 further includes a second bend 56 that defines a second arm 60 that extends downwardly toward the spacer portion 40 substantially parallel to the central portion 46. The second arm 60 has a lower tip 62 that is positioned flush against the peripheral upper edge of the spacer portion 40. In one embodiment, the upper fastener 50 is biased or spring loaded so that the lower tip 62 of the second arm 60 is urged to press against the upper edge of the spacer portion 40. In the illustrated embodiment, the second arm 60 is also bent at the lower tip 62 to provide the lower tip 62 with a rounded edge.

As shown in FIG. 2, the clip member 44 further includes a lower clamp or fastener 64 that extends downwardly from the bottom edge of the central portion 46. The lower fastener 64 is configured to removably clamp the mounting spacer 24 to the computer chassis 22, as described more fully below. The lower fastener 64 includes a first bend 66 which forms a first arm 70 that terminates at a tip 72 extending beyond the periphery of the spacer portion 40. The first arm 70 of the lower fastener 64 is oriented at an angle α relative to the central portion 46. The first arm 70 biased or spring loaded toward the spacer portion 40. Thus, when the first arm 70 is pulled away from the spacer portion 40, it automatically springs back toward the spacer portion 40 and assumes its natural orientation, as shown in FIG. 2.

As shown in FIG. 3, the width of the upper fastener 50 is slightly less than the width of the lower fastener 64. However, it will be appreciated that the sizes of the upper and lower fasteners 50 and 64, respectively, may be varied to fit within various mounting holes 30 and mounting slots 34 in a motherboard 20 and in a computer chassis 22. In one embodiment, the mounting slots 34 slots have dimensions of 0.03"×0.19".

Exemplary dimensions of one embodiment of the mounting spacer 24 are as follows. The width of the lower fastener 64 is approximately 0.17 inches and the width of the upper fastener 50 is approximately 0.08 inches. Referring to FIG. 2, the first bend 52 of the upper fastener 50 is spaced approximately 0.07 inches from the upper edge of the spacer portion 40. The angle θ of the first arm 54 of the upper fastener 50 is approximately 42°. Additionally, the length of the first arm 54 of the upper fastener 50 is approximately 0.22 inches and the length of the second arm 56 of the upper fastener 50 is approximately 0.20 inches.

Regarding the lower fastener 64, the angle α is approximately 68°. The first bend 66 in the lower fastener 64 is spaced approximately 0.10 inches from the lower edge of the spacer portion 40. The length of the first arm 70 of the lower fastener 64 is approximately 0.26 inches. The foregoing dimensions have been found to provide secure fastening characteristics when the mounting spacer 24 is attached to a computer chassis 22 and motherboard 20. However, it will be appreciated that the foregoing dimensions are merely exemplary and that the dimensions of the mounting spacer 24 may be varied based upon the circumstances.

FIGS. 5–9 illustrate the manner in which the mounting spacer 24 is used to mount the motherboard 20 to the chassis 22. As shown in FIG. 5, an installer first pulls the first arm 70 of the lower fastener 64 away from the spacer portion 40 and then inserts the first arm 70 of the lower fastener 64 through the mounting slot 34 in the chassis 22. As shown, the mounting spacer 24 is positioned at an angle relative to the plane of the chassis 22.

As shown in FIG. 6, the bias in the first arm 70 forces the mounting spacer 24 to pivot such that it orients substantially vertical relative to the chassis 22. In this position, the chassis 22 is compressed between the lower fastener 64 and the lower edge of the spacer portion 40. The mounting spacer 24 is thus secured to the chassis 22 via the lower fastener 64.

It will be appreciated that an installer may easily remove the mounting spacer 24 from the chassis 22 by pulling the lower fastener 64 out of the mounting slot 34 in the chassis 22.

As shown in FIG. 7, the installer may then mount the motherboard 20 to the mounting spacer 24. The installer first inserts the second bend 56 of the upper fastener 50 into the mounting hole 30 of the motherboard 20. As shown in FIG. 8, the installer then presses the motherboard 20 downward onto the mounting spacer 24 so that the first and second arms 54 and 60 of the upper fastener 50 are compressed toward each other. When so pressed, the first and second arms 54 and 60 are oriented such that the lower tip 62 of the second arm 60 rises relative to the spacer portion 40, thereby creating a gap 74 between the lower tip 62 of the second arm 60 and the upper edge of the spacer portion 40.

As shown in FIG. 9, the installer then continues to push the motherboard 20 downward until the lower tip 62 of the second arm 60 exits the mounting hole 30. At this point the second arm 60 springs to its natural orientation and the motherboard 20 is positioned within the gap 74. The motherboard 20 is thus compressed between the lower tip 62 of the upper fastener 50 and the mounting spacer 24. In this manner, the mounting spacer 24 securely retains the motherboard 20 in connection with the computer chassis 22. The motherboard 20 may be easily and quickly removed by reversing the previously-described steps.

FIG. 10 shows a flat material blank 76 that may be used to form the mounting spacer 24. The material blank 76 includes a main section 80 and two protrusions 82. Prior to use, the main section 80 is rolled into the shape of a cylinder to form the spacer portion 40 of the mounting spacer 24. The protrusions 82 are then folded at the broken fold lines to form the upper and lower fasteners 50 and 64. The mounting spacer 24 is preferably manufactured of an electrically-conductive material so that the mounting spacer 24 may be used as an electrical ground.

The mounting spacer 24 may thus be used to easily and securely mount a motherboard 20 to a computer chassis 22. The mounting spacer 24 eliminates the need for screws and also provides an electrical ground interface for the motherboard 20. It will be appreciated that the mounting spacer 24 may be used with an existing motherboard and computer chassis without the need for modifications to the motherboard or chassis.

Hence, although the foregoing description of the invention has shown, described, and pointed out fundamental novel features of the invention, it will be understood that various omissions, substitutions, and changes in the form of the detail of the apparatus and method as illustrated as well as the uses thereof, may be made by those skilled in the art without departing from the spirit of the invention. Consequently, the scope of the invention should not be limited to the foregoing discussion, but should be defined by the appended claims.

What is claimed is:

1. A device for mounting a planar electrical component to a chassis, comprising:

a spacer comprising a multi-planar wall configured to be positioned between the electrical component and the chassis; and an elongated clip coupled to said spacer, said elongated clip comprising an upper fastener extending in a first direction from said spacer, said upper fastener configured to removably clamp onto said board and secure said board to said spacer, and a lower fastener extending in a second direction from said spacer, said lower fastener configured to removably clamp onto said chassis and secure said chassis to said spacer.

2. The device of claim 1, wherein said upper fastener is configured to removably clamp said board against said spacer and said lower fastener is configured to removably clamp said chassis against said spacer.

3. The device of claim 1, wherein said upper fastener comprises an elongated strip of material having a tip biased toward said spacer, wherein said upper fastener is configured to clamp said board between said tip and said spacer.

4. The device of claim 3, wherein said elongated piece of material comprises a first arm extending away from said spacer, and a second arm extending toward said spacer.

5. The device of claim 1, wherein said upper fastener is configured to mate with a mounting hole in said board.

6. The device of claim 1, wherein said upper fastener contacts a grounding pad surrounding said mounting hole in said board.

7. The device of claim 1, wherein said lower fastener is configured to mate with a mounting slot in said chassis.

8. The device of claim 6, wherein said upper fastener comprises an electrically-conductive material.

9. The device of claim 1, wherein said spacer has a cylindrical shape.

10. A device for mounting a planar electrical component to a chassis, comprising:

a spacer having a first end and a second end wherein said spacer comprises a coiled wall, said coiled wall defining an elongated hollow space therein;

a first fastener extending outward from said first end of said spacer, said first fastener having a first arm biased toward said spacer, wherein said first fastener is configured to removably secure said electrical component between said first arm and said first end of said spacer; and a second fastener extending outward from said second end of said spacer, said second fastener having a second arm biased toward said second end of said spacer, wherein said second fastener is configured to removably secure said chassis between said second arm and said second end of said spacer.

11. The device of claim 10, wherein said spacer further comprises a central portion connecting said first fastener and said second fastener, said central portion extending through said elongated hollow space within said spacer.

12. The device of claim 11, wherein said central portion of said spacer is integrally formed with said spacer.

13. The device of claim 10, wherein said first arm of said first fastener includes a tip that is biased to contact a peripheral edge of said spacer.

14. The device of claim 13, wherein said first arm is configured to be inserted into a mounting hole in said board.

15. The device of claim 14, wherein said tip of said first arm contacts a grounding pad surrounding said mounting hole.

16. A device for removably securing a planar electrical component to a chassis, comprising:

a spacer comprising a multi-planar wall which defines a cylindrically shaped body;

means for removably clamping the electrical component to a first end of the spacer; and means for removably clamping the chassis to a second end of the spacer.

17. The device of claim 16, additionally comprising a center member integrally connected to said spacer, said center member connecting said means for removably clamping the board to the means for removably clamping the chassis.

18. The device of claim 16, wherein said means for removably clamping the board to a first end of the spacer comprises a clip biased to abut against the first end of the spacer.

19. The device of claim 18, wherein said clip comprises an elongated member having a first bend to define a first segment extending away from the first end of the spacer, and a second bend to define a second segment extending toward and abutting against the first end of the spacer.

20. The device of claim 16, wherein said means for removably clamping the chassis to a second end of the spacer comprises a clip biased to abut against the second end of the spacer.

21. The device of claim 20, wherein said clip comprises an elongated member having a first bend to define a first arm biased to abut against the first end of the spacer.

* * * * *

UNITED STATES PATENT AND TRADEMARK OFFICE
CERTIFICATE OF CORRECTION

PATENT NO. : 6,124,552  
DATED : September 26, 2000  
INVENTOR(S) : Craig L. Boe Page 1 of 1

It is certified that error appears in the above-identified patent and that said Letters Patent is hereby corrected as shown below:

Title page,
Item [57] ABSTRACT,
Line 3, change "includes a" to -- comprises a --.
Line 6, change "including an" to -- comprising an --.

Column 1,
Line 8, change "1992" to -- 1997 --.
Line 9, change "PATENT.047A" to -- MPATENT.046A --.

Column 4,
Line 18, change "arm 70 biased or" to -- arm 70 is biased or --.

Signed and Sealed this

Twenty-sixth Day of March, 2002

Attest:

JAMES E. ROGAN
*Attesting Officer*     *Director of the United States Patent and Trademark Office*